US011814735B2

United States Patent
Lee

(10) Patent No.: US 11,814,735 B2
(45) Date of Patent: Nov. 14, 2023

(54) CERAMIC SUBSTRATE AND CERAMIC SUBSTRATE MANUFACTURING METHOD

(71) Applicant: Amosense Co., Ltd., Cheonan (KR)

(72) Inventor: Ji-Hyung Lee, Cheonan (KR)

(73) Assignee: Amosense Co., Ltd., Cheonan (KR)

( * ) Notice: Subject to any disclaimer, the term of this patent is extended or adjusted under 35 U.S.C. 154(b) by 0 days.

(21) Appl. No.: 17/607,996

(22) PCT Filed: Mar. 25, 2020

(86) PCT No.: PCT/KR2020/004047
§ 371 (c)(1),
(2) Date: Nov. 1, 2021

(87) PCT Pub. No.: WO2020/222427
PCT Pub. Date: Nov. 5, 2020

(65) Prior Publication Data
US 2022/0316071 A1    Oct. 6, 2022

(30) Foreign Application Priority Data

May 2, 2019    (KR) .................. 10-2019-0051776

(51) Int. Cl.
*C23F 1/02*    (2006.01)
*B23K 1/20*    (2006.01)
*B23K 103/00*    (2006.01)

(52) U.S. Cl.
CPC ............... *C23F 1/02* (2013.01); *B23K 1/20* (2013.01); *B23K 2103/52* (2018.08)

(58) Field of Classification Search
None
See application file for complete search history.

(56) References Cited

U.S. PATENT DOCUMENTS

| | | | | | |
|---|---|---|---|---|---|
| 2003/0224199 | A1* | 12/2003 | Nakamura | ........... | H05K 1/0271 257/E23.106 |
| 2004/0238483 | A1* | 12/2004 | Tsukaguchi | .......... | H05K 1/0265 216/13 |

FOREIGN PATENT DOCUMENTS

| | | | |
|---|---|---|---|
| JP | 07288296 | A | 10/1995 |
| JP | 2013093355 | A | 5/2013 |
| KR | 20040043530 | A | 5/2004 |
| KR | 20100068593 | A | 6/2010 |
| KR | 20160095492 | A | 8/2016 |

(Continued)

OTHER PUBLICATIONS

Machine English Translation of KR 20180037866 A; Apr. 13, 2018 (Year: 2018).*

(Continued)

*Primary Examiner* — Shamim Ahmed
(74) *Attorney, Agent, or Firm* — Brooks, Cameron & Huebsch, PLLC

(57) ABSTRACT

The present invention is a method of manufacturing a ceramic substrate, the method including forming a mask on one surface of a metal layer, forming an inclined protrusion by etching the metal layer exposed by the mask, and bonding the metal layer on which the inclined protrusion is formed to a ceramic base material, and according to the present invention, the inclined protrusion is formed on an outer perimeter of the metal layer bonded to the ceramic base material to increase a bonding strength between the ceramic base material and the metal layer and facilitate a metal layer etching process.

9 Claims, 9 Drawing Sheets

(56) References Cited

FOREIGN PATENT DOCUMENTS

KR          20180037866 A      4/2018
WO     WO-2017222235 A1 * 12/2017   ....... H01L 23/49838

OTHER PUBLICATIONS

International Search Report and Written Opinion from related PCT Application No. PCT/KR2020/004047, dated Jul. 8, 2020, 9 pages.

\* cited by examiner

CERAMIC SUBSTRATE AND CERAMIC SUBSTRATE MANUFACTURING METHOD

TECHNICAL FIELD

The present invention relates to a ceramic substrate and a method of manufacturing a ceramic substrate and, more specifically, to a ceramic substrate and a method of manufacturing a ceramic substrate, which strongly maintain a bonding state between a ceramic base material and a metal layer despite a sudden temperature change.

BACKGROUND ART

Ceramic substrate are formed by integrally attaching a metal foil such as copper foil to a ceramic base material. The ceramic substrates are produced through manufacturing processes such as active metal brazing (AMB), direct bond copper (DBC), and the like, and may be classified into a ceramic AMB substrate, a ceramic DBC substrate, and the like according to differences in manufacturing processes.

Ceramic AMB substrates are manufactured by an AMB method of brazing a metal on a surface of a ceramic base material without performing metallization (or, metal wiring) on the surface of the ceramic base material.

Ceramic AMB substrates have high heat dissipation characteristics and reliability, and thus, are applied in applications such as vehicles, wind turbines, and high voltage DC transmission.

Referring to FIG. 1, a metal such as copper is brazed to a surface of a ceramic base material 10 to form a metal layer 20, a mask 30 (for example, a dry film) is arranged on a surface of the metal layer 20, and then a certain portion of a perimeter of the metal layer 20 is etched with an etchant, thereby completing manufacture of a ceramic AMB substrate of the related art (hereinafter, referred to as a basic-type ceramic AMB substrate).

In this case, because the basic-type ceramic AMB substrate includes the metal layer 20 of which an edge is formed to be inclined inward toward a lower surface, when a sudden temperature change occurs, cracks occur in the metal layer 20, or the metal layer 20 is separated from the ceramic base material 10.

For example, when a heat shock test for examining characteristics of ceramic AMB substrates (test conditions: material of ceramic substrates is alumina, ZTA(HPS), and AlN, and 1 cycle is about 30 minutes, and temperature varies from −50° C. to 150° C. per cycle) is performed, internal cracks and layer separation occur in about 100 cycles.

Ceramic AMB substrates are mainly used as power-related substrates, and thus, are required to have long lifespan, such that application of high-strength Si3N4 and SiC to ceramic substrates is being considered to slow occurrence of internal cracks and layer separation.

Si3N4 and SiC have high strength, but are expensive, and thus, the product price increases and product competitiveness decreases.

Thus, dimple-type ceramic AMB substrates, in which a plurality of dimples (or holes) 22 are formed along an edge of the metal layer 20 while an existing ceramic material is used, have been developed.

Referring to FIG. 2, a metal such as copper is brazed to a surface of the ceramic base material 10 to form a metal layer 20, a mask 30 having a plurality of dimples 22 formed on a surface of the metal layer 20 is arranged on a surface of the metal layer 20, and then a certain portion and hole portion of a perimeter of the metal layer 20 are etched with an etchant, thereby completing manufacture of a dimple-type ceramic AMB substrate.

Accordingly, the dimple-type ceramic AMB substrate has the plurality of dimples 22 formed along the perimeter of the metal layer 20, and thus, cracks and layer separation of the metal layer 20 may be prevented even in a sudden temperature change.

However, because the plurality of dimples 22 are formed in the dimple-type ceramic AMB substrate, an area of the metal layer 20 decreases, resulting in a deterioration of electrical characteristics such as electrical conductivity and thermal resistance. That is, electrical characteristics of ceramic AMB substrates are proportional to an area of the metal layer 20, and as the dimple-type ceramic AMB substrate has the plurality of dimples 22 formed in the metal layer 20, the area of the metal layer 20 decreases, thereby reducing electrical characteristics.

Also, as shown in FIG. 3, when the dimple-type ceramic AMB substrate has a dimple 22 formed only in a portion of the metal layer 20 to prevent deterioration of electrical characteristics, cracks occur in a dimple 22-free area of the metal layer 20 in a sudden temperature change, or the metal layer 20 is separated from the ceramic base material 10.

Also, in dimple-type ceramic AMB substrate, an area occupancy of the dimple 22 increases such that a resistance increases, and a strength and a bonding strength between the ceramic base material 10 and the metal layer 20 decrease, and thus, electrical characteristics required in application may not be satisfied.

Also, the dimple-type ceramic AMB substrate may not be applied to fine patterns because the area occupancy of the dimple 22 increases.

Meanwhile, when a thickness of the metal layer 20 is greater than or equal to a certain degree according to specs, it is difficult to perform etching and dimple forming processes and there are concerns about excessive consumption of time and substrate damage.

The matters described in the background art are intended to help the understanding of the background of the invention, and may include matters that are not the related art known to those of ordinary skill in the art to which this technology belongs.

DISCLOSURE

Technical Problem

The present invention is proposed to solve these problems of the related art and aims to provide a method of manufacturing a ceramic substrate having an inclined protrusion formed on an outer perimeter of a metal layer bonded to a ceramic base material to increase a bonding strength between the ceramic base material and the metal layer.

Also, the present invention also aims to provide a ceramic substrate and a method of manufacturing a ceramic substrate, the ceramic substrate having an inclined protrusion, which has an inclination within a set angle range with a ceramic base material, formed on an outer perimeter in which stress is concentrated, such as a short side, vertex, and edge of the outer perimeter of a metal layer bonded to the ceramic base material, to increase a bonding strength between the ceramic base material and the metal layer.

Also, metal layer etching and dimple forming processes may be further facilitated.

Technical Solution

A method of manufacturing a ceramic substrate according to an aspect of the present invention includes forming a mask on one surface of a metal layer, forming an inclined protrusion by etching the metal layer exposed by the mask, and bonding the metal layer on which the inclined protrusion is formed to a ceramic base material.

In this case, the forming of the inclined protrusion may include forming multi-step inclined protrusions in some regions of an outer perimeter of the metal layer, the some regions in which stress is concentrated, the forming of the multi-step inclined protrusions may include forming a multi-step inclined protrusion having a plurality of concavities formed in at least one of a short side, edge, and vertex of the metal layer, the forming of the multi-step inclined protrusions may include forming of a multi-step inclined protrusion having a gradient of 27 degrees or more and 33 degrees or less with the ceramic base material, and the gradient may be an angle between a surface of the ceramic base material and a line connecting a point where the multi-step inclined protrusion is in contact with the ceramic base material to a vertex of a protrusion formed between concavities.

Meanwhile, the forming of the inclined protrusion may further include forming tapered inclined protrusions on remaining regions of the outer perimeter of the metal layer, the forming of the tapered inclined protrusions may include forming a tapered inclined protrusion having a curved inclination on the outer perimeter of the metal layer and forming a tapered inclined protrusion having a gradient of 27 degrees or more and 33 degrees or less with the ceramic base material, and the gradient may be an angle between a surface of the ceramic base material and a line connecting two points where the tapered inclined protrusion is in contact with the metal layer and the ceramic base material.

The forming of the inclined protrusion may include forming an inclined protrusion connected to an outer perimeter of the metal layer and protruding toward an outer perimeter of the ceramic base material rather than toward an imaginary line orthogonal to the ceramic substrate and forming an inclined protrusion whose protrusion length increases toward the ceramic base material, and the forming of the inclined protrusion may include forming an inclined protrusion concavely curved toward the ceramic base material.

Also, the metal layer and the ceramic layer (→ceramic base material?) are bonded by a filler layer.

Advantageous Effects

According to a ceramic substrate and a method of manufacturing a ceramic substrate of the present invention, the ceramic substrate has improved electrical characteristics such as electrical conductivity and thermal resistance due to an increase in an area of a metal layer, compared to those of dimple-type ceramic AMB substrates of the related art, and thus, crack resistance and separation resistance, which are equal to those of the dimple-type ceramic AMB substrates of the related art, can be realized.

Also, according to a ceramic substrate and a method of manufacturing a ceramic substrate, because an area is relatively larger than that of dimple-type ceramic AMB substrates of the related art, when equivalent electrical characteristics are formed, relatively high crack resistance and separation resistance can be realized.

Also, according to a ceramic substrate and a method of manufacturing a ceramic substrate, because an area is relatively larger than that of dimple-type ceramic AMB substrates of the related art, strength and bonding strength can be maintained strong, and application to fine patterns is possible.

Also, according to a ceramic substrate and a method of manufacturing a ceramic substrate, compared to ceramic AMB substrates of the related art, useful life extends and reliability is ensured.

Also, according to a ceramic substrate and a method of manufacturing a ceramic substrate, an etching shape of a mask (i.e., a dry film) is controlled when an inclined protrusion is formed, and thus, two or three additional etching operations are not performed, thereby reducing post-processing costs.

Also, according to a ceramic substrate and a method of manufacturing a ceramic substrate, an inclined protrusion is formed in a metal layer, thereby dispersing energy on an outer perimeter of the metal layer and improving long-term reliability of AMB insulated gate bipolar mode resistor (IGBT) substrates.

Also, according to a ceramic substrate and a method of manufacturing a ceramic substrate, a multi-step inclined protrusion having an inclination within a set angle range with a ceramic base material is formed on an outer perimeter in which stress is concentrated, such as a short side, vertex, and edge of the outer perimeter of a metal layer, and tapered inclined protrusions are formed on remaining portions of the outer perimeter of the metal layer, thereby forming a thickness that minimizes bonding stress while maintaining bonding strength, and preventing the metal layer from being separated from the ceramic base material.

MODE FOR INVENTION

Figure 1:
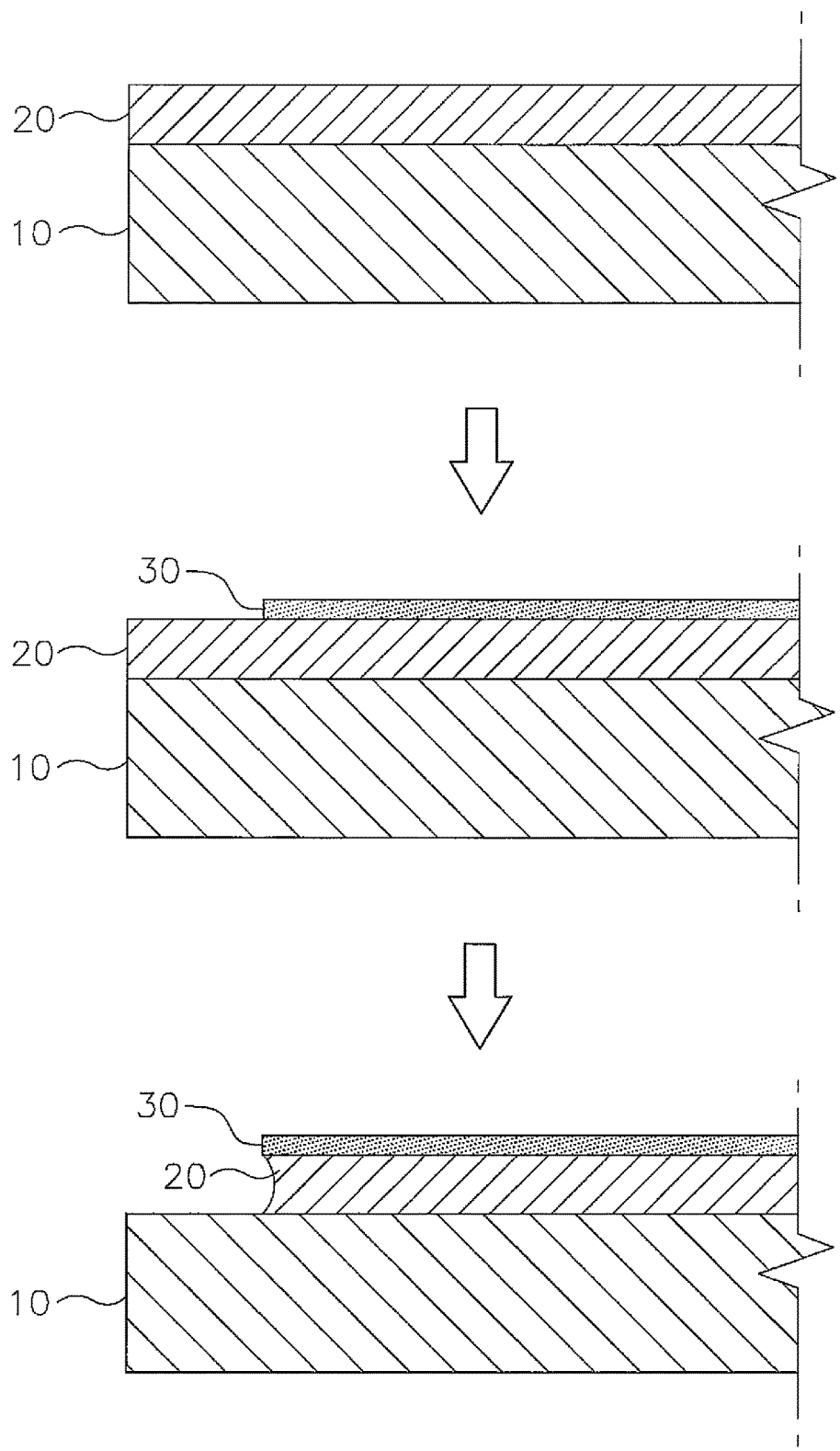
FIGS. 1 to 3 are diagrams for explaining a ceramic substrate of the related art.
Figure 2:
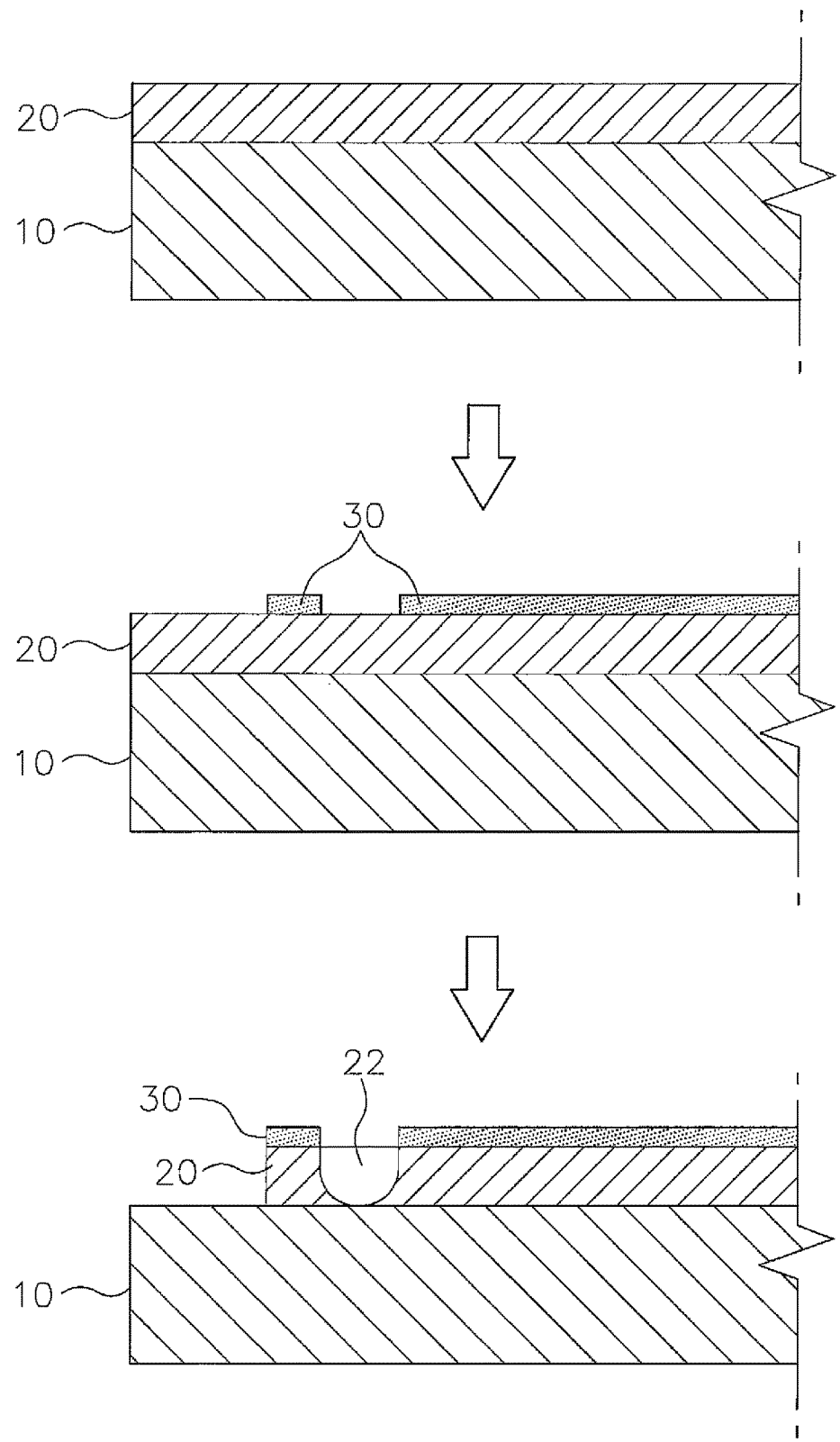
Figure 3:
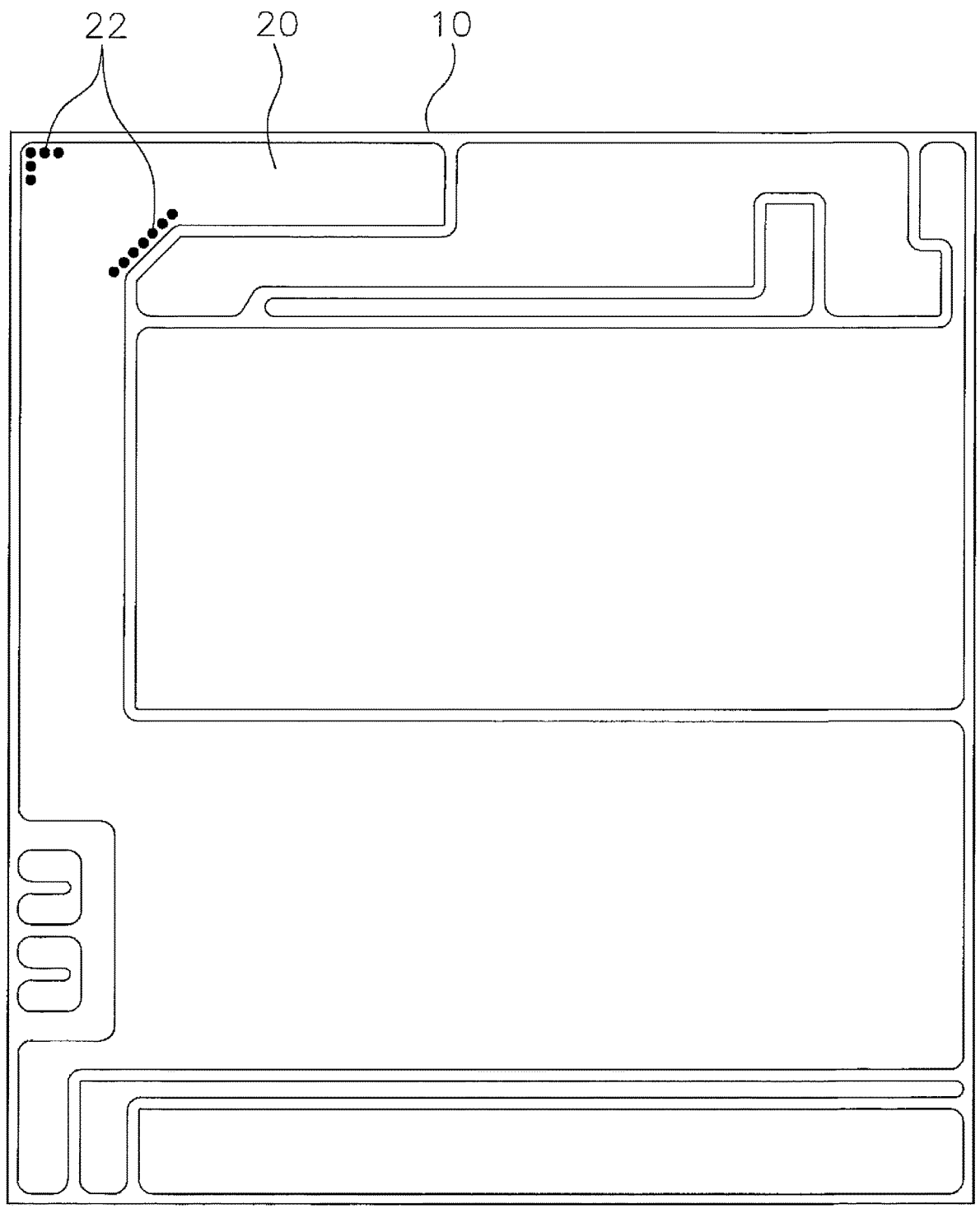

Hereinafter, the most exemplary embodiment of the present invention will be described with reference to the accompanying drawings in order to describe in detail enough that those of ordinary skill in the art may easily implement the technical idea of the present invention. First, in adding reference numerals to the components of each drawing, it should be noted that the same components are given the same reference numerals as much as possible even though they are indicated on different drawings. In addition, in describing the present invention, when it is determined that a detailed description of a related known configuration or function may obscure the gist of the present invention, the detailed description thereof will be omitted.

Figure 4:
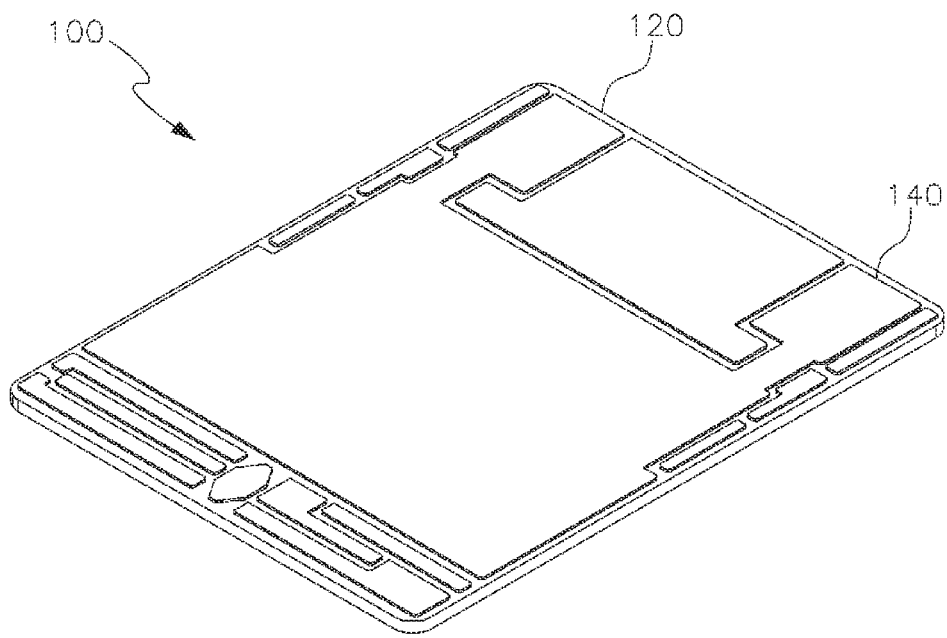
FIG. 4 is a diagram for explaining a ceramic substrate according to an embodiment of the present invention.

Referring to FIG. 4, a ceramic substrate 100 according to an embodiment of the present invention includes a ceramic base material 120 and a metal layer 140.

The ceramic base material 120 is formed of a ceramic material selected from zirconia toughened alumina (ZTA), aluminum nitride (MN), aluminum oxide (alumina, Al2O3), and silicon nitride (SiN, Si3N4). The ceramic base material 120 may be formed of a synthetic ceramic material including at least one of ZTA, aluminum nitride, aluminum oxide, and silicon nitride.

For example, the ceramic base material 120 may be formed to include ZTA having a composition ratio of about 9% or about 15%, and at least one of aluminum nitride, aluminum oxide, and silicon nitride having a remaining composition ratio (about 91% or about 85%).

In addition, the ceramic base material 120 may be transformed into a ceramic material that may be used in a power module or the like.

The ceramic base material 120 may be formed to have a thickness of about 0.32 mm to about 0.635 mm according to a composition ratio. In this case, fine protrusions may be formed on a surface of the ceramic base material 120 through chemicals or physical polishing in order to strengthen bonding strength between the ceramic base material 120 and the metal layer 140.

The metal layer 140 includes a metal thin film. In this case, the metal layer 140 may be formed of a copper foil formed of copper (Cu) powder. The metal layer 140 may be formed of a metal thin film including one of copper (Cu) powder, silver (Ag) powder, aluminum (Al) powder, nickel (Ni) powder, tin (Sn) powder, and phosphorus (In) powder, or a mixed metal thin film. The metal layer 140 may be formed of a mixed metal thin film such as TiCu, NiTi, TiCu, NiNb, CuMo, or TiAg.

The metal layer 140 is bonded to at least one surface of the ceramic base material 120. That is, the metal layer 140 is directly bonded to one surface of the ceramic base material 120 through a brazing process. In this case, the metal layer 140 may be bonded to the ceramic base material 120 through a bonding layer interposed therebetween.

The metal layer 140 is formed to have an area smaller than that of the ceramic base material 120, and an outer perimeter of the metal layer 140 is spaced apart from an outer perimeter of the ceramic base material 120 by a certain distance and bonded to an inner side of one surface of the ceramic base material 120.

An inclined protrusion, which has a downward inclination toward the outer perimeter of the ceramic base material 120, is formed on the outer perimeter of the metal layer 140. In this case, at least one of a tapered inclined protrusion and a multi-step inclined protrusion may be formed on the outer perimeter of the metal layer 140.

Figure 5:
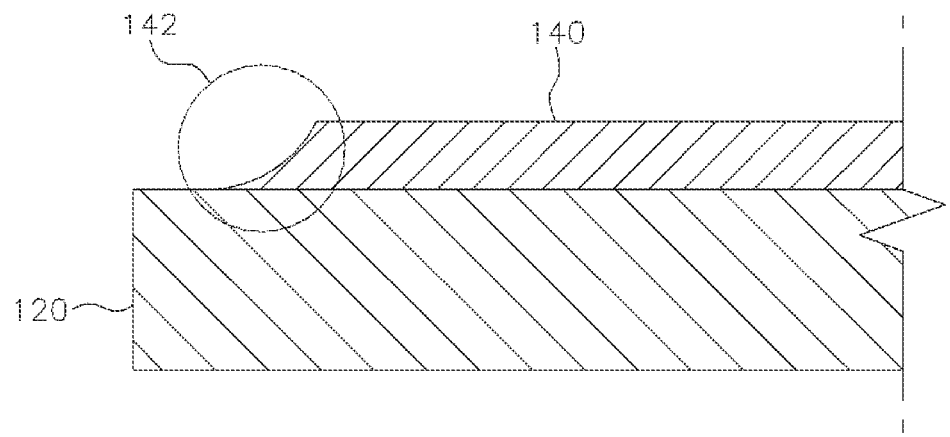
FIGS. 5 to 8 are diagrams for explaining a metal layer of FIG. 4.

As shown in FIG. 5, a tapered inclined protrusion 142 having a curved inclination, which is formed on the metal layer 140, may be formed.

The tapered inclined protrusion 142 is connected to an upper outer perimeter of the metal layer 140 and protrudes toward the outer perimeter of the ceramic base material 120 rather than toward an imaginary line orthogonal to the ceramic substrate 100. The tapered inclined protrusion 142 has a shape having a curved inclination, and may be formed in a shape concavely curved toward the ceramic base material 120.

Figure 6:
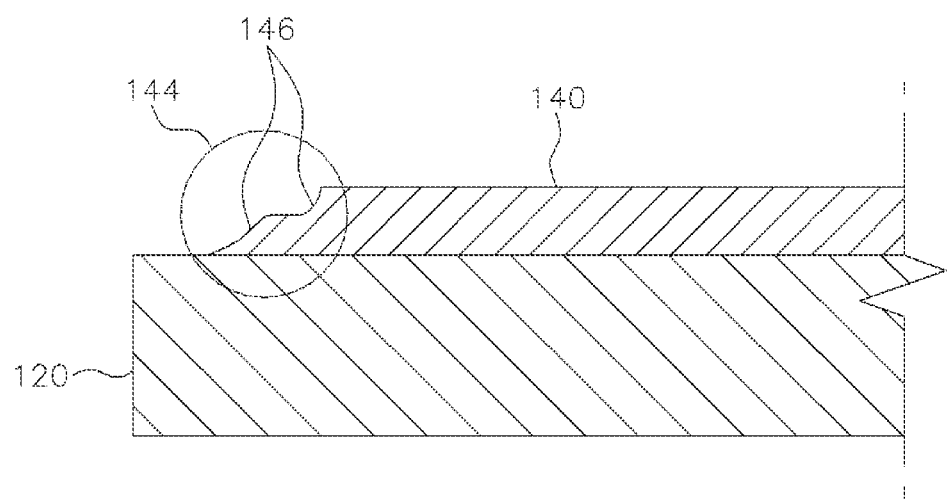

As shown in FIG. 6, the metal layer 140 may include a multi-step inclined protrusion 144 having a plurality of concavities 146 formed therein. That is, the metal layer 140 may include a multi-step inclined protrusion 144 having two concavities 146 formed therein.

Of course, the metal layer 140 may include a multi-step inclined protrusion 144 having three concavities 146 formed therein. In this case, a sharp protrusion may be formed at a portion of the multi-step inclined protrusion 144, in which a concavity 146 and a concavity 146 are in contact with each other.

When a thickness of the outer perimeter of the metal layer 140 increases, bonding stress between the metal layer 140 and the ceramic base material 120 increases.

When the bonding stress increases, the metal layer 140 may be separated from the ceramic base material 120 in a sudden temperature change.

Because bonding stress needs to be minimized while a bonding strength is maintained to prevent the metal layer 140 from being separated from the ceramic base material 120, an inclined protrusion having a gradient within a set angle range with the ceramic base material 120 (the tapered inclined protrusion 142, the multi-step inclined protrusion 144) is formed on the outer perimeter of the metal layer 140 to minimize a thickness of the outer perimeter. Here, the gradient is, for example, an angle between a surface of the ceramic base material 120 and a line connecting two points where the inclined protrusion is in contact with the metal layer 140 and the ceramic base material 120.

Figure 7:
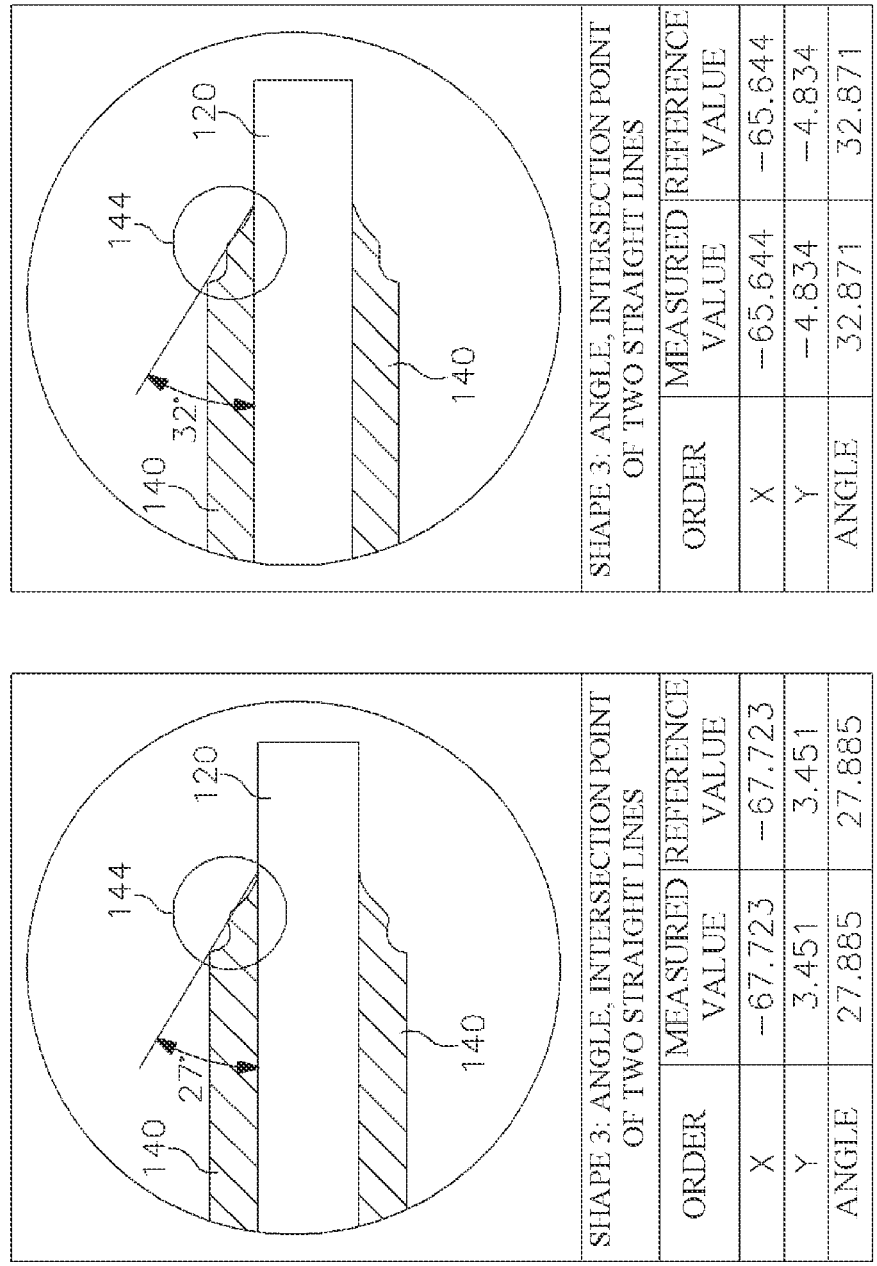

In this case, referring to FIG. 7, the tapered inclined protrusion 142 and the multi-step inclined protrusion 144 are each formed to have a gradient ($\theta$) of about 33 degrees or less with the ceramic base material 120 to minimize bonding stress. Here, when the gradient is too small, a bonding strength decreases such that the tapered inclined protrusion 142 and the multi-step inclined protrusion 144 may be separated from the ceramic base material 120, and thus, the tapered inclined protrusion 142 and the multi-step inclined protrusion 144 may be preferably formed to have a gradient ($\theta$) of about 27 degrees or more and 33 degrees or less with the ceramic base material 120 to minimize bonding stress.

Figure 8:
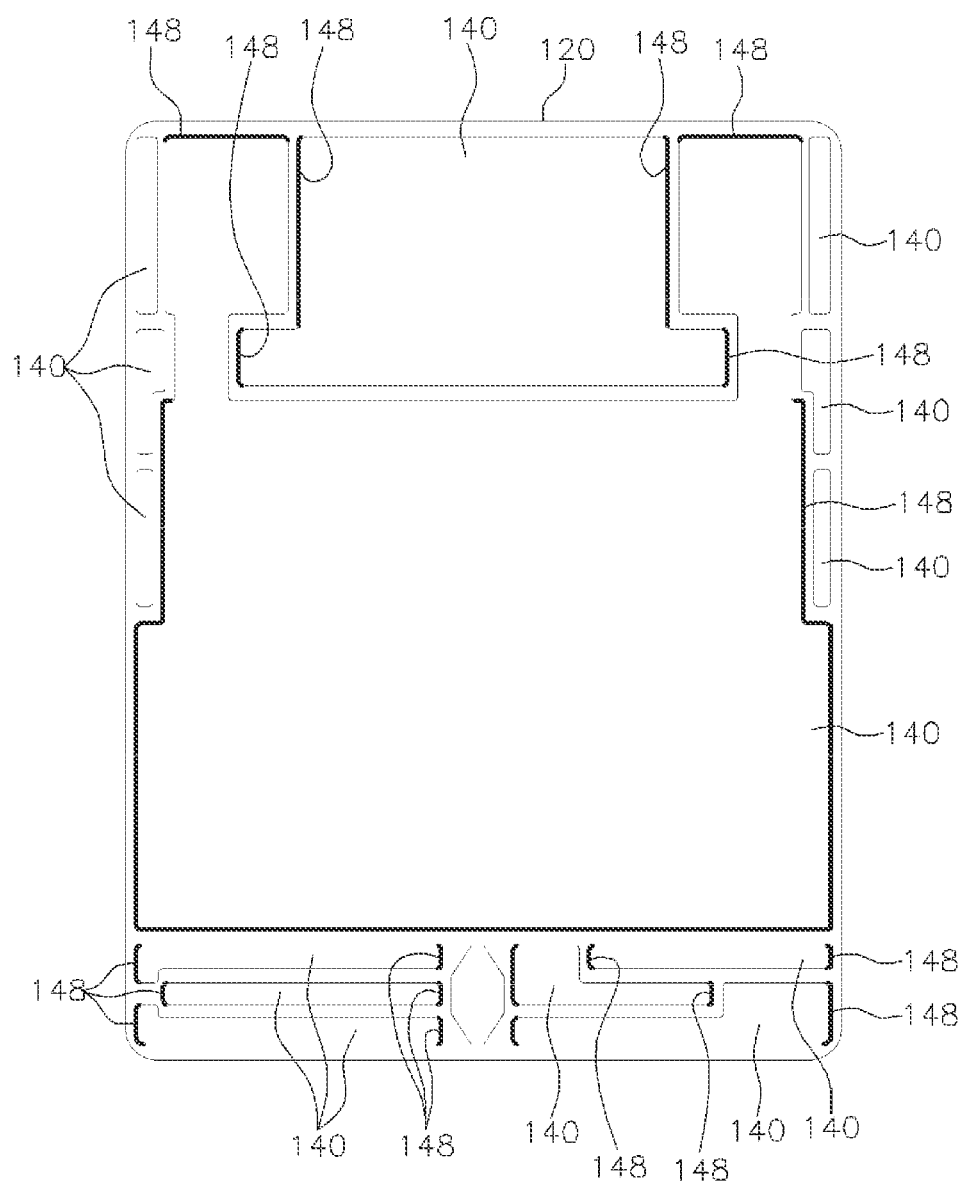

Meanwhile, referring to FIG. 8, multi-step inclined protrusions 144 are formed in some regions 148 of the outer perimeter of the metal layer 140, the some regions 148 in which bonding stress is concentrated, and tapered inclined protrusions 142 may be formed on other portions thereof.

That is, because stress is concentrated in the some regions 148 such as a short side, vertex, and edge of the metal layer 140, multi-step inclined protrusions 144, which may be formed to be relatively thin, are formed on portions of the outer perimeter of the metal layer 140, which correspond to the short side, the vertex, and the edge, and tapered inclined protrusions 142 are formed on remaining portions of the outer perimeter thereof.

In this case, the tapered inclined protrusion 142 and the multi-step inclined protrusion 144 may be each formed to have a gradient within a set angle range (for example, about 27 degrees or more and 33 degrees or less) with the ceramic base material 120.

Here, the gradient may be an angle between a surface of the ceramic base material 120 and a line connecting two points where the tapered inclined protrusion 142 is in contact with the metal layer 140 and the ceramic base material 120, or may be an angle between a surface of the ceramic base material 120 and a line connecting a point where the multi-step inclined protrusion 144 is in contact with the ceramic base material 120 to a vertex of a protrusion formed between concavities 146.

Figure 9:
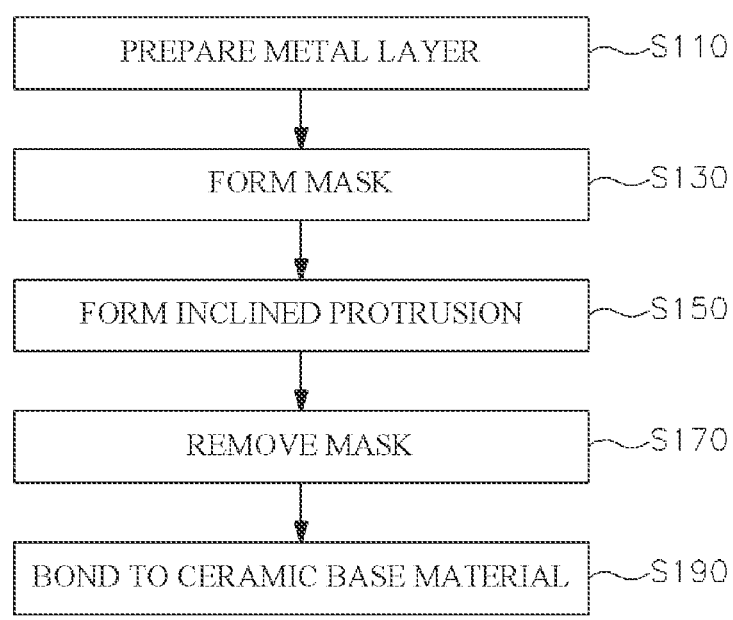
FIGS. 9 and 10 are diagrams for explaining a method of manufacturing a ceramic substrate according to an embodiment of the present invention.
Figure 10:
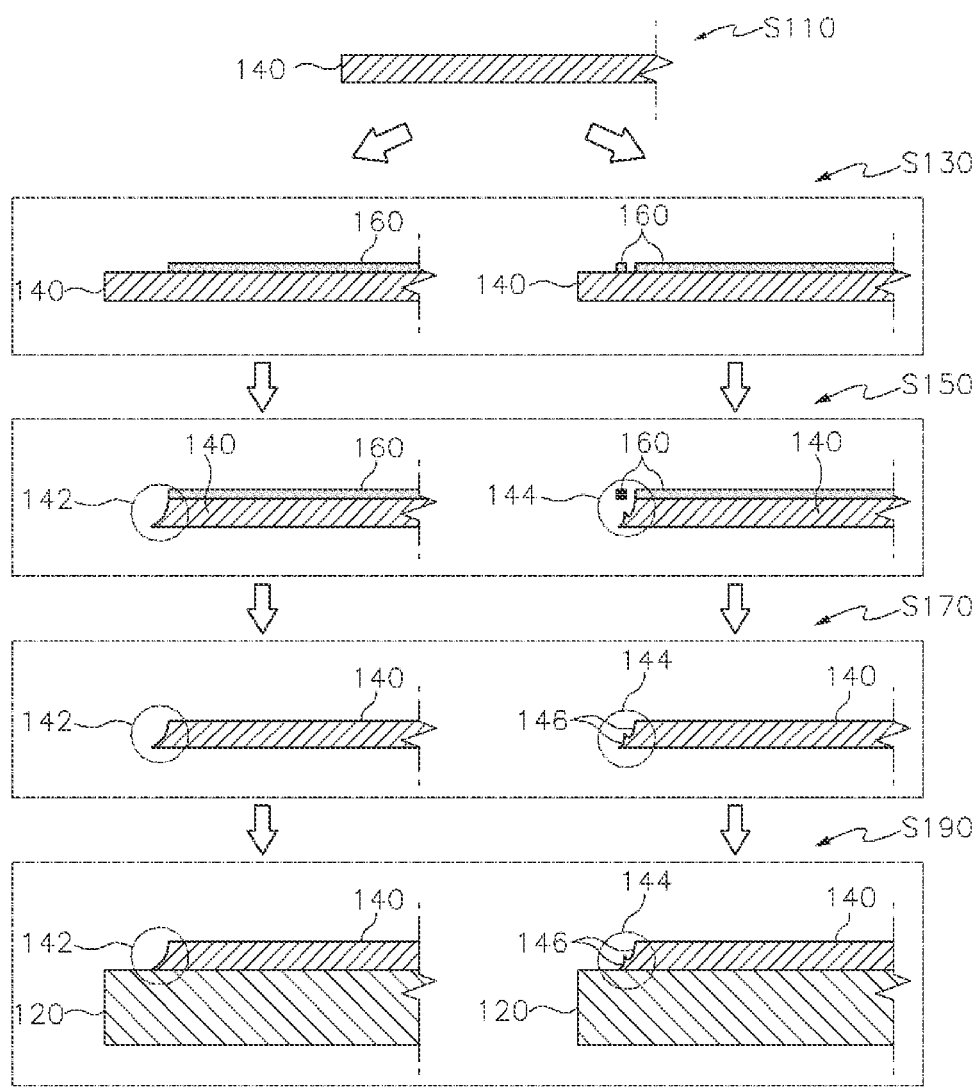

Referring to FIGS. 9 and 10, a method of manufacturing a ceramic substrate according to an embodiment of the present invention includes forming a tapered inclined protrusion 142 and a multi-step inclined protrusion 144 on a metal layer 140 and then bonding the metal layer 140 to a ceramic base material 120.

That is, in a case where a thickness of the metal layer 140 is greater than or equal to a certain degree, when the metal layer 140 is formed on the ceramic base material 120 and then the metal layer 140 is etched, an etching process is disadvantageous such that it is difficult to form the designed tapered inclined protrusion 142 and the multi-step inclined protrusion 144, and thus, in the present invention, the tapered inclined protrusion 142 and the multi-step inclined protrusion 144 are separately formed on the metal layer 140, and then a process of bonding to the ceramic base material 120 is performed.

That is, included are preparing a metal layer 140 (operation S110), forming a mask 160 (operation S130), forming an inclined protrusion (operation S150), removing the mask 160 (operation S170), and bonding to a ceramic base material 120 (operation S190).

A metal layer in the preparing of the metal layer 140 (operation S110) may include a metal thin film including one of copper (Cu) powder, silver (Ag) powder, aluminum (Al) powder, nickel (Ni) powder, tin (Sn) powder, and phosphorus (In) powder, or a mixed metal thin film, and may be a mixed metal thin film such as TiCu, NiTi, TiCu, NiNb, CuMo, or TiAg.

In the forming of the mask 160 (operation S130), the mask 160 is formed on one surface of the metal layer 140. That is, in the forming of the mask 160 (operation S130), the mask 160 (for example, a dry film) having an area smaller than an area of the metal layer 140 is arranged on one surface of the metal layer 140 to form a tapered inclined protrusion 142. In the forming of the mask 160 (operation S130), an outer perimeter of the metal layer 140 and an outer perimeter of the mask 160 are spaced apart from each other, so that the mask 160 is arranged on an inner side of one surface of the metal layer 140.

Meanwhile, in the forming of the mask 160 (operation S130), a plurality of masks 160 may be formed on one surface of the metal layer 140. That is, in the forming of the mask 160 (operation S130), at least two masks 160 may be formed on one surface of the metal layer 140 to form a multi-step inclined protrusion 144.

In the forming of the mask 160 (operation S130), the arranged mask 160 is exposed to light and cured to form the mask 160 on one surface of the metal layer 140. In this case, in the forming of the mask 160 (operation S130), the mask 160 for forming the multi-step inclined protrusion 144, which may be formed to be relatively thin, may be formed on portions of the outer perimeter of the metal layer 140, such as a short side, vertex, and edge thereof, and the mask 160 for forming the tapered inclined protrusion 142 may be formed on remaining portions of the outer perimeter.

In the forming of the inclined protrusion (operation S150), the metal layer 140 is etched to form the inclined protrusion on the outer perimeter thereof. In this case, in the forming of the inclined protrusion (operation S150), a portion of the metal layer 140 (i.e., the outer perimeter of the metal layer 140), which is exposed by the mask 160, is etched with an etchant (for example, ferric chloride (FeCl3)) to form the inclined protrusion having a shape by which a lower outer perimeter of the metal layer 140 is greater than an upper outer perimeter thereof.

In the forming of the inclined protrusion (operation S150), at least one of the tapered inclined protrusion 142 and the multi-step inclined protrusion 144 is formed on the outside of the metal layer 140. That is, in the forming of the inclined protrusion (operation S150), the tapered inclined protrusion 142, which is connected to the upper outer perimeter of the metal layer 140, protrudes toward an outer perimeter of the ceramic base material 120 with respect to an imaginary line orthogonal to the ceramic substrate 100, and has a curved inclination, or the multi-step inclined protrusion 144 having a plurality of concavities 146 formed therein is formed.

In this case, in the forming of the inclined protrusion (operation S150), multi-step inclined protrusions 144 may be formed on portions of the outer perimeter, in which bonding stress is concentrated, and tapered inclined protrusions 142 may be formed on remaining portions of the outer perimeter. That is, bonding stress is concentrated in some regions 148 of the metal layer 140, such as a short side, vertex, and edge, and thus, in the forming of the inclined protrusion (operation S150), multi-step inclined protrusions 144, which may be formed to be relatively thin, are formed on portions of the outer perimeter of the metal layer 140, which correspond to the short side, the vertex, and the edge. In the forming of the inclined protrusion (operation S150), tapered inclined protrusions 142 are formed on remaining portions (for example, along side) of the outer perimeter, in which relatively low bonding stress is concentrated.

In the forming of the inclined protrusion (operation S150), when etching is performed at the same concentration, time, and rate (degree) as basic-type ceramic AMB substrates, the outer perimeter of the metal layer 140 is formed in an inwardly rounded shape.

Thus, in the forming of the inclined protrusion (operation S150), it is preferable to etch the outer perimeter of the metal layer 140 with an etchant having a concentration lower than an etchant used for manufacturing basic-type ceramic AMB substrates, shorten etching time, or slow an etching rate (degree).

Accordingly, when basic-type ceramic AMB substrates of the related art are manufactured with an etching degree of 100%, the forming of the inclined protrusion (operation S150) includes forming an inclined protrusion with an etching degree of about 85%.

Of course, in the forming of the inclined protrusion (operation S150), the outer perimeter of the metal layer 140 may be etched at an etching rate slower than an etching rate in manufacturing basic-type ceramic AMB substrates, or the outer perimeter of the metal layer 140 may be etched with an etching time shorter than an etching time in manufacturing basic-type ceramic AMB substrates.

In the forming of the inclined protrusion (operation S150), an inclined protrusion having a gradient within an set angle range with the ceramic base material 120 to be bonded thereto is formed. Here, the gradient may be an angle between a surface of the ceramic base material 120 and a line connecting two points where the tapered inclined protrusion 142 is in contact with the metal layer 140 and the ceramic base material 120, or may be an angle between a surface of the ceramic base material 120 and a line connecting a point where the multi-step inclined protrusion 144 is in contact with the ceramic base material 120 to a vertex of a protrusion formed between concavities 146.

When a thickness of the outer perimeter of the metal layer 140 increases, bonding stress between the metal layer 140 and the ceramic base material 120 increases. When the bonding stress increases, the metal layer 140 may be separated from the ceramic base material 120 in a sudden temperature change.

Because bonding stress needs to be minimized while a bonding strength is maintained to prevent the metal layer 140 from being separated from the ceramic base material 120, the tapered inclined protrusion 142 and the multi-step inclined protrusion 144, each having a gradient within a set angle range with the ceramic base material 120, are formed on the outer perimeter of the metal layer 140 to minimize a thickness.

In this case, the tapered inclined protrusion 142 and the multi-step inclined protrusion 144 are each formed to have a gradient ($\theta$) of about 33 degrees or less with the ceramic base material 120 to minimize bonding stress. Here, when the gradient is too small, a bonding strength decreases such that the tapered inclined protrusion 142 and the multi-step inclined protrusion 144 may be separated from the ceramic base material 120, and thus, the tapered inclined protrusion 142 and the multi-step inclined protrusion 144 may be preferably formed to have a gradient (θ) of about 27 degrees or more and 33 degrees or less with the ceramic base material 120 to minimize bonding stress.

In the removing of the mask 160 (operation S170), after the forming of the inclined protrusion, the mask 160 arranged on one surface of the metal layer 140 is etched with an etchant. Accordingly, in the etching of the mask 160 (operation S170), the mask 160 is removed to manufacture a ceramic substrate 100 in a final state.

As such, after forming of the tapered inclined protrusion 142 and the multi-step inclined protrusion 144 on the metal layer 140, bonding to the ceramic base material 120 is performed (operation S190).

The ceramic base material 120 is formed of a ceramic material selected from ZTA, aluminum nitride, aluminum oxide (alumina), and silicon nitride. In this case, the ceramic base material 120 may be a synthetic ceramic material including at least one of ZTA, aluminum nitride, aluminum oxide, and silicon nitride.

For example, the ceramic base material 120 may include ZTA having a composition ratio of about 9% or about 15%, and at least one of aluminum nitride, aluminum oxide, and silicon nitride having a remaining composition ratio (about 91% or about 85%).

In preparing the ceramic base material 120 (operation S190), the ceramic base material 120 having a thickness of about 0.32 mm to about 0.635 mm according to a composition ratio is prepared.

In this case, in the preparing of the ceramic base material 120 (operation S190), fine protrusions may be formed on a surface of the ceramic base material 120 in order to strengthen a bonding strength between the metal layer 140 and the ceramic base material 120. That is, a surface of the ceramic base material 120 is roughened by chemical treatment using chemicals or physical treatment using polishing, sand blasting, or the like, to form fine protrusions. In addition, any example of roughening the surface of the ceramic base material 120 may be modified and implemented.

The metal layer 140 is formed on at least one surface of the ceramic base material 120. In this case, a metal thin film is bonded to at least one surface of the ceramic base material 120 to form the metal layer 140, and the metal layer 140 is formed to entirely cover the at least one surface of the ceramic base material 120.

A metal thin film may be bonded to one surface of the ceramic base material 120 through a brazing process to form the metal layer 140, or a bonding layer may be interposed between the ceramic base material 120 and a metal thin film to form the metal layer 140.

A metal thin film including one of copper (Cu) powder, silver (Ag) powder, aluminum (Al) powder, nickel (Ni) powder, tin (Sn) powder, and phosphorus (In) powder, or a mixed metal thin film may be bonded to one surface of the ceramic base material 120 to form the metal layer 140.

A mixed metal thin film such as TiCu, NiTi, TiCu, NiNb, CuMo, or TiAg may be bonded to one surface of the ceramic base material 120 to form the metal layer 140.

As described above, according to a ceramic substrate and a method of manufacturing a ceramic substrate of the present invention, the ceramic substrate has improved electrical characteristics such as electrical conductivity and thermal resistance due to an increase in an area of a metal layer, compared to those of dimple-type ceramic AMB substrates of the related art, and thus, crack resistance and separation resistance, which are equal to those of the dimple-type ceramic AMB substrates of the related art, can be realized.

Also, according to a ceramic substrate and a method of manufacturing a ceramic substrate, because an area is relatively larger than that of dimple-type ceramic AMB substrates of the related art, when equivalent electrical characteristics are formed, relatively high crack resistance and separation resistance can be realized.

Also, according to a ceramic substrate and a method of manufacturing a ceramic substrate, because an area is relatively larger than that of dimple-type ceramic AMB substrates of the related art, strength and bonding strength can be maintained strong, and application to fine patterns is possible.

Also, according to a ceramic substrate and a method of manufacturing a ceramic substrate, compared to ceramic AMB substrates of the related art, useful life extends and reliability is ensured.

Also, according to a ceramic substrate and a method of manufacturing a ceramic substrate, an etching shape of a mask (i.e., a dry film) is controlled when an inclined protrusion is formed, and thus, two or three additional etching operations are not performed, thereby reducing post-processing costs.

Also, according to a ceramic substrate and a method of manufacturing a ceramic substrate, an inclined protrusion is formed in a metal layer, thereby dispersing energy on an outer perimeter of the metal layer and improving long-term reliability of AMB insulated gate bipolar mode resistor (IGBT) substrates.

Also, according to a ceramic substrate and a method of manufacturing a ceramic substrate, a multi-step inclined protrusion having an inclination within a set angle range with a ceramic base material is formed on an outer perimeter in which stress is concentrated, such as a short side, vertex, and edge of the outer perimeter of a metal layer, and tapered inclined protrusions are formed on remaining portions of the outer perimeter of the metal layer, thereby forming a thickness that minimizes bonding stress while maintaining bonding strength, and preventing the metal layer from being separated from the ceramic base material.

Also, even when a thickness of the metal layer is greater than or equal to a certain degree, an etching process is facilitated to make the process more advantageous.

Exemplary embodiments according to the present invention have been described hereinbefore, but may be modified in various forms, and it is understood that those of ordinary skill in the art may make various modifications and variations without departing from the scope of the claims of the present invention.

EXPLANATION OF REFERENCED NUMERALS

100: ceramic substrate 120: ceramic base material
140: metal layer 142: tapered inclined protrusion
144: multi-step inclined protrusion 146: concavity

The invention claimed is:
1. A method of manufacturing a ceramic substrate, the method comprising:
forming a mask on one surface of a metal layer;
forming an inclined protrusion by etching the metal layer exposed by the mask; and bonding the metal layer to a ceramic base material after forming the inclined protrusion on the metal layer, wherein the forming of the inclined protrusion comprises forming multi-step inclined protrusions in some regions of an outer perimeter of the metal layer, the some regions in which stress is concentrated, wherein the forming of the multi-step inclined protrusions comprises forming a multi-step inclined protrusion having a plurality of concavities formed in at least one of a short side, edge, and vertex of the metal layer.

2. The method of claim 1, wherein the forming of the multi-step inclined protrusions comprises forming a multi-step inclined protrusion having a gradient of 27 degrees or more and 33 degrees or less with the ceramic base material, and the gradient is an angle between a surface of the ceramic base material and a line connecting a point where the multi-step inclined protrusion is in contact with the ceramic base material to a vertex of a protrusion formed between concavities.

3. The method of claim 1, wherein the forming of the inclined protrusion further comprises forming tapered inclined protrusions on remaining regions of the outer perimeter of the metal layer.

4. The method of claim 3, wherein the forming of the tapered inclined protrusions comprises forming a tapered inclined protrusion having a curved inclination on the outer perimeter of the metal layer.

5. The method of claim 3, wherein the forming of the tapered inclined protrusions comprises forming a tapered inclined protrusion having a gradient of 27 degrees or more and 33 degrees or less with the ceramic base material, and the gradient is an angle between a surface of the ceramic base material and a line connecting two points where the tapered inclined protrusion is in contact with the metal layer and the ceramic base material.

6. The method of claim 1, wherein the forming of the inclined protrusion comprises forming an inclined protrusion connected to an outer perimeter of the metal layer and protruding toward an outer perimeter of the ceramic base material rather than toward an imaginary line orthogonal to the ceramic substrate.

7. The method of claim 1, wherein the forming of the inclined protrusion comprises forming an inclined protrusion whose protrusion length increases toward the ceramic base material.

8. The method of claim 1, wherein the forming of the inclined protrusion comprises forming an inclined protrusion concavely curved toward the ceramic base material.

9. The method of claim 1, wherein the metal layer and the ceramic layer are bonded by a filler layer.

* * * * *